(12) United States Patent
Nozières et al.

(10) Patent No.: US 8,102,703 B2
(45) Date of Patent: Jan. 24, 2012

(54) MAGNETIC ELEMENT WITH A FAST SPIN TRANSFER TORQUE WRITING PROCEDURE

(75) Inventors: Jean-Pierre Nozières, Le Sappey en Chartreuse (FR); Bernard Dieny, Lans-en-Vercors (FR)

(73) Assignee: Crocus Technology, Grenoble Cedex (FR)

( * ) Notice: Subject to any disclaimer, the term of this patent is extended or adjusted under 35 U.S.C. 154(b) by 400 days.

(21) Appl. No.: 12/502,467

(22) Filed: Jul. 14, 2009

(65) Prior Publication Data

US 2011/0013448 A1 Jan. 20, 2011

(51) Int. Cl.
*G11C 11/15* (2006.01)

(52) U.S. Cl. ..... 365/173; 365/158; 365/171; 365/225.5; 365/243.5; 365/209

(58) Field of Classification Search ................... 365/173, 365/158, 171, 209, 225.5, 243.5
See application file for complete search history.

(56) References Cited

U.S. PATENT DOCUMENTS

| | | | |
|---|---|---|---|
| 5,640,343 A | 6/1997 | Gallagher et al. | |
| 5,695,864 A | 12/1997 | Slonczewski | |
| 6,172,902 B1 | 1/2001 | Wegrowe et al. | |
| 6,430,085 B1 | 8/2002 | Rizzo | |
| 6,532,164 B2 | 3/2003 | Redon et al. | |
| 6,535,416 B1 | 3/2003 | Daughton et al. | |
| 6,602,677 B1 | 8/2003 | Wood et al. | |
| 6,950,335 B2 | 9/2005 | Dieny et al. | |
| 6,956,763 B2 | 10/2005 | Akerman et al. | |
| 7,154,773 B2 * | 12/2006 | Braun et al. | 365/158 |
| 7,622,784 B2 * | 11/2009 | Trouilloud | 257/421 |
| 7,791,917 B2 * | 9/2010 | Nozieres et al. | 365/50 |
| 7,894,228 B2 * | 2/2011 | Nozieres et al. | 365/50 |
| 7,957,181 B2 * | 6/2011 | Nozieres et al. | 365/171 |
| 2006/0141640 A1 | 6/2006 | Huai et al. | |

\* cited by examiner

*Primary Examiner* — Pho M Luu

(74) *Attorney, Agent, or Firm* — Pearne & Gordon LLP

(57) ABSTRACT

A magnetic tunnel junction, including a reference layer having a fixed magnetization direction, a first storage layer having a magnetization direction that is adjustable relative to the magnetization direction of the reference layer by passing a write current through said magnetic tunnel junction, and an insulating layer disposed between said reference layer and first storage layer; characterized in that the magnetic tunnel junction further comprises a polarizing device to polarize the spins of the write current oriented perpendicular with the magnetization direction of the reference layer; and wherein said first storage layer has a damping constant above 0.02. A magnetic memory device formed by assembling an array of the magnetic tunnel junction can be fabricated resulting in lower power consumption.

40 Claims, 4 Drawing Sheets

MAGNETIC ELEMENT WITH A FAST SPIN TRANSFER TORQUE WRITING PROCEDURE

FIELD

The present disclosure relates to magnetic tunnel junction based magnetic element using a spin transfer torque (STT) write scheme in particular magnetic random memory (MRAM) cells or logic elements.

BACKGROUND

In their simplest implementation, a magnetic random memory (MRAM) cell comprises a magnetic tunnel junction formed from a thin insulating layer sandwiched between a first magnetic layer, or reference layer, characterized by a fixed magnetization and a second magnetic layer, or storage layer, characterized by a magnetization which direction can be changed upon writing of the MRAM cell. When the respective magnetizations of the reference and storage layers are oriented antiparallel, the magnetic tunnel junction resistance is high ($R_{max}$). On the other hand, when the respective magnetizations of the reference and storage layers are oriented parallel, the magnetic tunnel junction resistance becomes low ($R_{min}$). The MRAM cell is read by comparing its junction resistance to the junction resistance of a reference cell, or several reference cells, $R_{ref}$, having a junction resistance of $R_{ref}=(R_{min}+R_{max})/2$.

It has also been proposed to use magnetic tunnel junctions in logic elements wherein the magnetic junction is used to store the results of the operation or to define the functionality of the logic element (see for instance "Fabrication of a Nonvolatile Full Adder Based on Logic-in-Memory Architecture Using Magnetic Tunnel Junctions" by Matsunaga et. al., *Appl. Phys. Exp.* 1 (2008) 091301). The description below is described for MRAM element but it will be obvious for the man skilled in the art to translate it to logic type of applications.

The MRAM cell can be written, by switching the magnetization direction of the storage layer, using different write operation schemes. In a first write operation scheme, two magnetic fields are applied coincidently in a cross-point architecture as described in U.S. Pat. No. 5,640,343, No. 6,430,085 and No. 6,956,763. This write operation scheme can be implemented in different manners that are known as magnetic field switching, Stoner-Wohlfarth Switching, Toggle Switching, Precessional switching, etc.

Alternatively, the MRAM cell can be written by a coincident magnetic field and a thermal pulse as described in U.S. Pat. No. 6,950,335 and No. 6,535,416. This approach is referred to as thermally assisted switching (TAS).

The MRAM cell can also be written using a spin polarized current flowing through the magnetic tunnel junction, as described initially in U.S. Pat. No. 5,695,864 and No. 6,172,902. As the spin polarized current acts as a local (magnetic) torque, this approach is known as spin transfer torque (STT).

Another possible write operation scheme includes a coincident pulse of spin polarized current flowing through the magnetic tunnel junction and a thermal heating current pulse as described in U.S. Pat. No. 6,950,335. This approach is referred to as combined Spin transfer plus Thermally Assisted Switching (STT+TAS).

The write operation scheme based on STT is viewed as the most promising route for high density MRAM device using MRAM cells because the spin polarized write current scales directly with the MRAM cell size, which is not the case in the other write operation scheme implementations. In the STT-based write operation, the switching of the storage layer magnetization depends on the spin polarized current density which scales with the inverse of the area of the MRAM cell. Moreover, switching of the storage layer magnetization with the spin polarized current can be fast and the MRAM cell size can be minimized since no magnetic field line is required.

Most practical implementations of the STT-based write operation so far involve a so-called "longitudinal" configuration, whereupon the spins of the spin polarized current are injected antiparallel (in the same plane or in-plane) as the storage layer magnetization to be switched. This can be done using storage layer materials having in-plane magnetization, i.e., having magnetization in the plane of the layers e.g. wafers, or perpendicular magnetization, e.g. having magnetization out of the plane of the magnetic wafers.

MRAM cells with a STT-based write operation, however, suffers from several drawbacks. For example, the spin polarized write current density required to switch the storage layer magnetization is large (currently ~4 MA/cm$^2$ for a 10 ns pulse width) and increases dramatically for shorter pulse width. This leads to large and unpractical MRAM cell sizes due to underlying selection transistors sourcing such current densities. It also leads to high power dissipation and to a potential wear and correlated lack of reliability of the magnetic tunnel junction, in particular of the insulating layer.

Moreover, insuring the stability of the data written in the MRAM cell by switching the magnetization of the storage layer requires achieving simultaneously good stability in the storage layer magnetization direction and a small write current in order to avoid the drawbacks above. This is becoming a major issue at feature sizes smaller than 45 nm.

Finally, the write operation speed is limited by the stochastic nature of switching. Indeed, if the intrinsic STT switching speed is fast (in the order of ns), the switching of the magnetization is triggered by thermal activation which is stochastic in nature. As a result, the practical switching time using the STT-based write operation is limited to about 10 ns or longer.

The stability of written data can be improved using perpendicularly magnetized magnetic layers, as recently demonstrated by Nakayama et al., *Journ. Appl. Phys.* 103, 07A710 (2008). Alternatively, a good tradeoff between stability of written data and write current can be obtained by using a combination of TAS and STT, as proposed in U.S. Pat. No. 6,950,335. None of these solutions, however, allows for a reduction in the write current density.

In order to decrease the write current density, several approaches have been proposed: more particularly, U.S. Pat. No. 6,603,677 proposes using a synthetic antiferromagnetic (SAF) multilayer as storage layer. The corresponding decrease of the current density is small (about 3 MA/cm$^2$ at 10 ns pulse width) but the true benefit is a more coherent internal magnetization in the magnetic cell, leading to a narrower current distribution within the magnetic cell array.

In their publication, Hayakawa et al., *Jap. Journ. Appl. Phys.* 44 (2005) L1247, describes a method for decreasing the saturation magnetization of the storage layer. Here, the storage layer is assumed to be magnetized in-plane, and the write current scales directly with saturation magnetization. However, this approach has a severe drawback due to a sharp decrease of stability when the saturation magnetization is decreased caused by a correlative decrease of shape anisotropy. It is therefore not practical beyond a certain limit.

U.S. Patent Application Publication US2006/0141640 discloses using a dual magnetic tunnel junction structure, e.g. two symmetrical spin polarizing layer. This latter approach allows for using writing current in the order of 1 MA/cm$^2$ for a 10 ns pulse width but results in an increased complexity in the magnetic tunnel junction manufacturing process.

In an alternative approach, U.S. Pat. No. 6,532,164 discloses a MRAM cell configuration where the magnetic tunnel junction is formed from an insulating layer disposed between a first magnetic layer having a first magnetization direction, and a second magnetic layer having a second magnetization direction that is adjustable relative to the first magnetization direction. The magnetic tunnel junction also comprises a polarizing layer having a magnetization oriented perpendicular to the magnetization of the first and second magnetic layers. When a write current flows through the magnetic tunnel junction, the polarizing layer orients the spins of the write current perpendicularly to the magnetization of the first and second magnetic layers, and the write current switches the magnetization second magnetic layer through a precession of said magnetization in the plane of the magnetic layer. This configuration enables the use of a low write current density and permits an increased writing speed. However, in such a configuration, the second layer magnetization rotation frequency is in the range of 1 to 20 GHz (see *Applied Physics Letters*, 86 (2005), 022505) which is too high for any practical application such as in memory devices. Indeed, such high rotation frequencies would require a write current pulse in the sub-nanosecond range, which is too short in large arrays of MRAM cells with parasitic RC time constants.

SUMMARY

The present application discloses a magnetic tunnel junction, magnetic element and memory device which overcome at least some limitations of the prior art.

According to the embodiments, a magnetic tunnel junction, can comprises a reference layer having a fixed magnetization direction, a first storage layer having a magnetization direction that is adjustable relative to the magnetization direction of the reference layer by passing a write current through said magnetic tunnel junction, and an insulating layer disposed between said reference layer and first storage layer; wherein the magnetic tunnel junction further comprises a polarizing device to polarize the spins of the write current oriented perpendicular with the magnetization direction of the reference layer; and wherein said first storage layer has a damping constant above 0.02.

In an embodiment, the polarizing device is a polarizing layer having a magnetization oriented perpendicular to the magnetization direction of the first storage layer.

In another embodiment, the magnetization of said polarizing layer is oriented out of plane and the respective magnetizations of the reference and first storage layers are oriented in-plane.

In another embodiment, the magnetization of said polarizing layer is oriented in-plane and the respective magnetizations of the reference and first storage layers are oriented out-of-plane.

In yet another embodiment, said first storage layer is made from a transition metal-based alloy containing at least one element chosen from Pt, Pd, Ir, Au, or a rare earth element.

In yet another embodiment, said magnetic tunnel junction further comprises a second storage layer having a magnetoresistance greater than 50%.

The disclosure also pertains to a magnetic element, such as a memory or logic element, formed by inserting the magnetic tunnel junction between a current line and a selection transistor; and to a magnetic memory device formed by assembling an array comprising a plurality of the magnetic elements.

The disclosed magnetic tunnel junction according to the embodiments disclosed herein allows using a write current with intensity down to 1 $MA/cm^2$, and thus, obtaining a memory device, comprising the magnetic tunnel junction, having low overall power consumption. Due to low switching time of the storage layer of the disclosed magnetic tunnel junction, typically comprised between 1 and 30 ns, the disclosed junction has a faster write speed than the one in a conventional STT-MRAM cell.

BRIEF DESCRIPTION OF THE DRAWINGS

The preferred embodiments will be better understood with the aid of the description of an embodiment given by way of example and illustrated by the figures, in which.

DETAILED DESCRIPTION OF THE PREFERRED EMBODIMENTS

Figure 1:
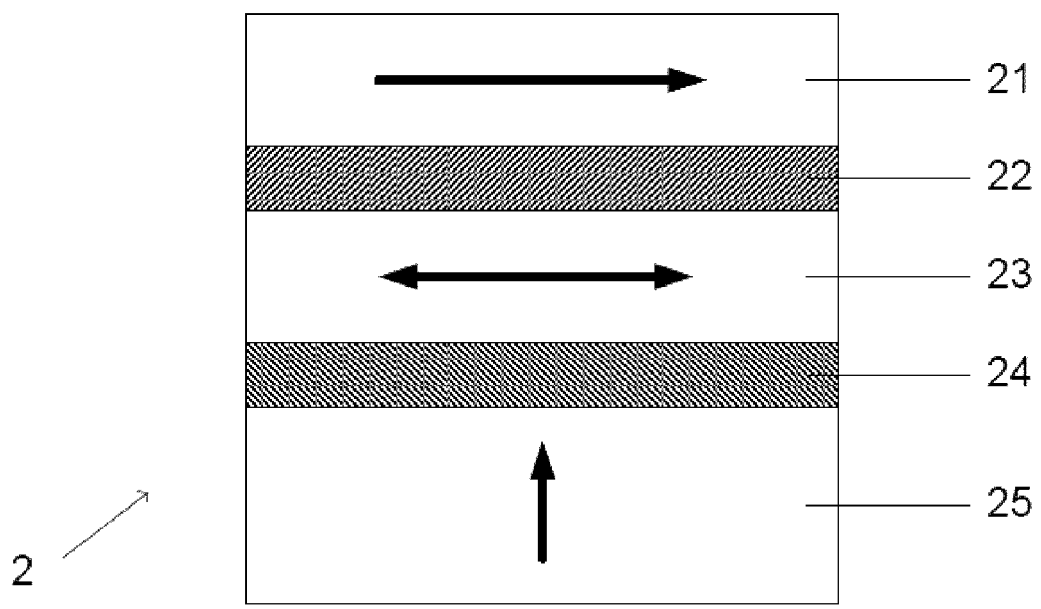
FIG. 1 shows a magnetic tunnel junction comprising a reference layer, a storage layer and an insulating layer, according to an embodiment.

In an embodiment represented in FIG. 1, a magnetic tunnel junction 2 is formed from an insulating layer 22 disposed between a reference layer 21, having a fixed magnetization direction, and a first storage layer 23, having a magnetization direction that is adjustable relative to the magnetization direction of the reference layer 21. The magnetic tunnel junction 2 further comprises a polarizing device for polarizing the spin of the electrons. In the example of FIG. 1, the polarizing device is formed from a polarizing layer 25 and a non-magnetic spacer layer 24 separating the polarizing layer 25 from the first storage layer 23.

In a preferred embodiment, the magnetization directions of the reference and first storage layers 21, 23 are oriented in-plane, i.e., in the plane of the respective reference and first storage layers 21, 23; while the polarizing layer 25 has a magnetization being oriented out-of-plane, i.e., in a plane that is perpendicular to the one of the polarizing layer 25, reference and first storage layers 21, 23.

In an embodiment not represented, a magnetic element, such as a memory or logic element, can be formed by inserting the magnetic tunnel junction 2 between a current line connected, for example, to the junction 2 on the top of the reference layer 21, and a selection transistor connected, for example, to the bottom of the polarizing layer 25 and controllable via a word line.

During a write operation, data is written by applying a single write current pulse (not shown) through the magnetic tunnel junction 2, via the current line when the selection transistor is in the passing mode. More particularly, the electrons of the write current become polarized when passing through the polarizing magnetic layer 25 according to the current flow direction, so that the spins of the write current electrons penetrating into the first storage layer 23 are in majority oriented along the magnetization direction of the polarizing magnetic layer 25. When the amplitude of this spin-polarized write current is sufficient, the spins of the write current are capable of switching the second magnetization direction of the magnetization of the first storage layer 23 by transfer of the angular spin moment between the spin-polarized carriers (electrons) and the magnetic moment of the first storage layer 23. This transfer of the angular spin is also known under the expression "spin transfer torque (STT)". In a perpendicular configuration, such as the configuration of FIG. 1, where the polarizing layer 25 has a magnetization oriented out-of-plane and perpendicular to the in-plane magnetization of the reference and first storage layers 21, 23, the electrons of the write current are polarized by the polarizing magnetic layer 25 with a direction perpendicular to the plane of the layers 21, 23. The magnetization of the first storage layer 23, when subjected to the write current with the so polarized spins, will then rotate within the plane of the first storage layer 23 in a precession mode.

In another embodiment not represented, the magnetic element is formed by inserting the magnetic tunnel junction 2 between the word line, without the selection transistor, and the current line, or bit line, in the so-called cross-point configuration.

Any other configurations of the magnetic element allowing for switching the second magnetization direction of the first storage layer 23 using the spin-polarized current are also possible.

An advantage of the magnetic element based on the magnetic tunnel junction 2 with the perpendicular configuration of FIG. 1 is a low write current density and a high writing speed. Here, the rotation of the storage layer magnetization within the plane of the reference and first storage layers 21, 23 can have switching time of the magnetization in the sub-nanosecond range. In contrast, the magnetization reversal taking place in conventional MRAM cells and written with a spin-transfer current is performed with a parallel configuration, where the spins of the write current are oriented in the plane of the first storage layer 23, or the magnetization layer to be switched. In this parallel configuration, switching the storage layer magnetization is triggered by thermal activation being stochastic in nature, and the write operation speed is limited by switching times typically longer than 10 ns.

In the case of the perpendicular configuration of FIG. 1, the in-plane precession frequency f of the second layer magnetization can be expressed by Equation 1.

$$f = \frac{\gamma |a_J|}{2\pi\alpha} = \frac{\gamma}{2\pi\alpha}\frac{\hbar}{2e}\left[\frac{g(\theta)}{M_s t}\right] \cdot J \qquad \text{(Equation 1)}$$

In Equation 1, J is the spin polarized write current, $M_s$ the saturation magnetization, t the thickness of the first storage layer 23 and $\gamma$ the gyromagnetic ratio (about $1.8\ 10^7\ Oe^{-1}s^{-1}$), $\hbar$ is Planck's constant ($1.05\ 10^{-27}$ erg·s) and e the electron charge ($4.8\ 10^{-10}$ esu in CGS units). The symbol $a_J$ represents the amplitude of spin torque in magnetic field units, and $g(\theta)$ is the spin torque efficiency from Slonczewsky's model (see *J. Magn. Magn. Mat.* 159 (1996) L1) which depends upon the angle $\theta$ between the polarization of the write current spins and the magnetization of the storage layer 23 ($\theta=\pi/2$ in the perpendicular configuration). The intrinsic damping constant $\alpha$ has a value of typically about 0.01 in Co-based alloys usually used in magnetic tunnel junctions.

The critical write current $J_c$ required for triggering the spin precession in the perpendicular configuration of FIG. 1 is given by Equation 2.

$$J_c = \frac{2e}{\hbar}\left[\frac{M_s t}{g(\pi/2)}\right]\frac{H_K}{2} \qquad \text{(Equation 2)}$$

In Equation 2, $H_K$ is the effective anisotropy field of the first storage layer 23, the effective anisotropy combining the shape anisotropy, magnetocrystalline anisotropy, and magnetoelastic anisotropy (if any) of the first storage layer 23. Therefore, the precession frequency f at the onset of the precession motion of the writing current spins is given by Equation 3.

$$f = \frac{\gamma}{2\pi\alpha}\frac{g(\theta)}{g(\pi/2)}\frac{H_K}{2} \qquad \text{(Equation 3)}$$

With usual materials parameters as described above, Equation 3 yields a minimum precession frequency f varying between about 1 GHz to 10 GHz, depending upon the effective anisotropy $H_K$, which is usually dominated by the shape anisotropy. This precession frequency range corresponds to characteristic switching time of the magnetization (half precession time constant) of about 500 ps to 50 ps, which is too fast for practical use in circuit design.

Reducing the effective anisotropy $H_K$ can yield to a reduced thermal stability of the first storage layer 23. Indeed, in order to achieve thermal stability of the first storage layer magnetization against thermal fluctuations for a period of about 10 years, corresponding to the requested life time of a memory device, the criterion $M_s H_K V > 100 k_B T$ must be fulfilled, where V is the volume or dimension of the magnetic tunnel junction 2.

The precession frequency f is independent from the saturation magnetization which is often used as a way to decrease the critical write current $J_c$. The precession frequency f, however, varies inversely with $\alpha$. Thus, increasing the damping factor by a factor of ten allows decreasing the switching time of the magnetization in the range comprised between 1 ns to 30 ns. This range is practical for logic circuits design with nanosecond scale RC time constants.

Gilbert damping constants are often derived from ferromagnetic resonance (FMR) experiments which involve small angle excitations of the magnetization, for example, typically of the order of a few degrees. In the spin-torque induced precession motion described in the present disclosure, the precession angle is quite large, typically almost 90° and, additional spin-lattice relaxation phenomena, that are not necessarily present in FMR experiments, can take place. Nevertheless, a material with large magnetic dissipation (measured by the area of the hysteresis loop) is likely to have a large effective damping for these large precession angles. Spin-lattice relaxation often takes place via spin-orbit coupling so that adding impurities having large spin orbit interactions (such as Pt, Pd, Au, rare earth impurities) can possibly increase the damping in magnetic materials.

Figure 2:
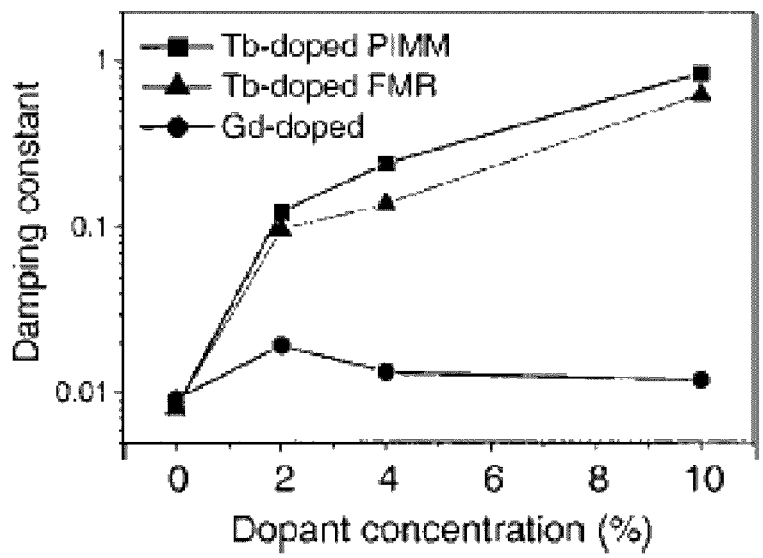
FIG. 2 illustrates the increase of the damping constant as a function of rare earth element concentration in a Co, Fe, and Ni-based alloy.
Figure 3:
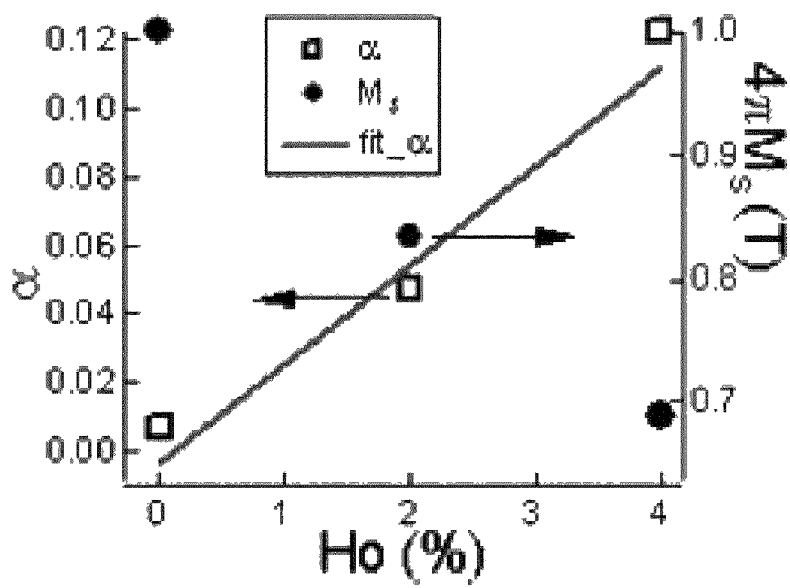
FIG. 3 shows the increase of damping constant as a function of Holmium concentration in a $Ni_{80}Fe_{20}$-based alloy.

For example, in the case the first storage layer 23 is made of an alloy such as a Co, Fe, or Ni-based alloy with additions of one or several elements such as B, Ta, Cr, Zr, or Nb, it is possible to increase the Gilbert damping constant by adding rare earth impurities with large orbital moments such as Tb, Dy, Ho, Er, etc. This is illustrated on FIG. 2 taken from Reference Russek et al., *Journ. Appl. Phys.* 91 (2002), p. 8659. FIG. 3 shows the increase of Gilbert damping constant with Holmium impurities in a Ni80Fe20-based alloy, from Reference Benatmane et al., *J. Appl. Phys.* 105, 07D314 (2009).

Similarly, the inclusion of impurity elements such as Pt, Pd, Ir, or Au can increase the Gilbert damping constant since these impurities have strong spin-orbit interactions.

In the embodiment of FIG. 1, the first storage layer 23 can be made of a transition metal-based alloy, such a Co, Fe, or Ni-based alloy, preferentially comprising additions of one or several elements such as B, Ta, Cr, Zr, or Nb, and one or several rare earth impurities with large orbital moments such as Tb, Dy, Ho, and Er. The first storage layer 23 thus made has a Gilbert damping constant increasing with the rare earth impurity content as shown in FIGS. 2 and 3, yielding switching time of the magnetization in a range comprised between 1 ns to 30 ns. This switching time range is practical for logic circuits design with nanosecond scale RC time constants.

Figure 4:
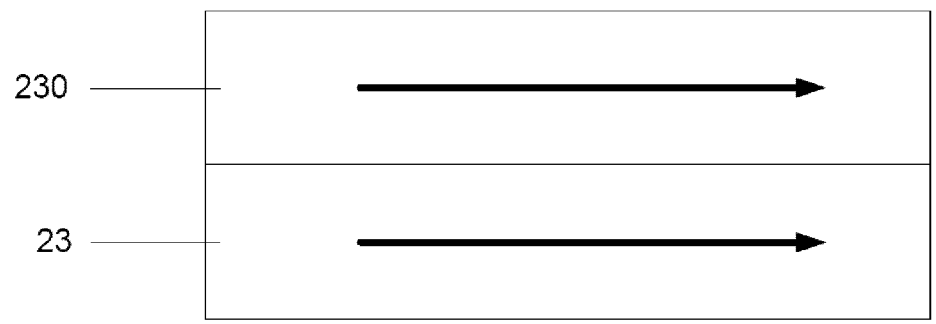
FIG. 4 illustrates the storage layer of FIG. 1 according to an embodiment.

In a preferred embodiment shown in FIG. 4, the magnetic tunnel junction 2 further comprises a second storage layer 230, adjacent to the first storage layer 23 and made of a material allowing for large magnetoresistance (TMR) amplitude, preferentially above 50%. The second storage layer 230 can be made of a transition metal-based alloy such a Co, Fe, or Ni-based alloy, preferentially comprising additions of one or several elements such as B, Ta, Cr, Zr, or Nb. Preferably, the second storage layer 230 is in contact with the insulating layer 22. In the example of FIG. 4, the first storage layer 23 can have a thickness comprised between 1 nm and 2 nm, and can be made of an $(NiFe)_{96}Tb_4$ alloy; while the second storage layer 230 can be made of a CoFeB alloy.

Figure 5:
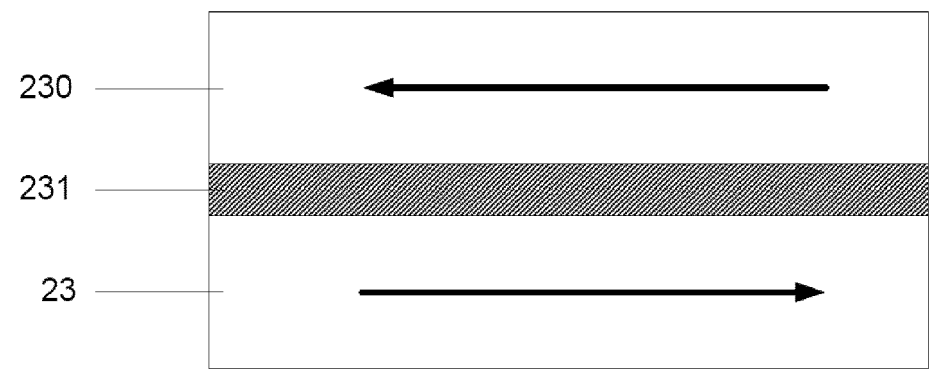
FIG. 5 illustrates the storage layer of FIG. 1 according to another embodiment.

In another embodiment shown in FIG. 5, the magnetic tunnel junction 2 further comprises a coupling layer, here, an antiferromagnetically coupling layer 231 disposed between the first storage layer 23 with the large damping constant and the second storage layer 230 having large TMR amplitude. Preferably, the second storage layer 230 is in contact with the insulating layer 22. Such a configuration containing the first and second storage layers 23, 230 and the antiferromagnetically coupling layer 231 is also known as a synthetic antiferromagnetic free layer. The antiferromagnetically coupling layer 231 consists of a thin non magnetic layer; preferably a ruthenium layer with a thickness comprised between 0.6 nm and 0.9 nm, and provides the antiparallel (e.g. antiferromagnetic) coupling between the first and second storage layers 23, 230. Compared to a single storage layer, the synthetic antiferromagnetic free layer configuration of FIG. 5 has a larger effective volume and thus, a better thermal stability. Moreover, due to magnetic flux closure between the two antiparallel magnetization direction of the first and second storage layers 23, 230, the local magnetization within the first and second storage layers 23, 230, is more uniform, resulting in a more coherent switching of these two layers 23, 230.

Figure 6:
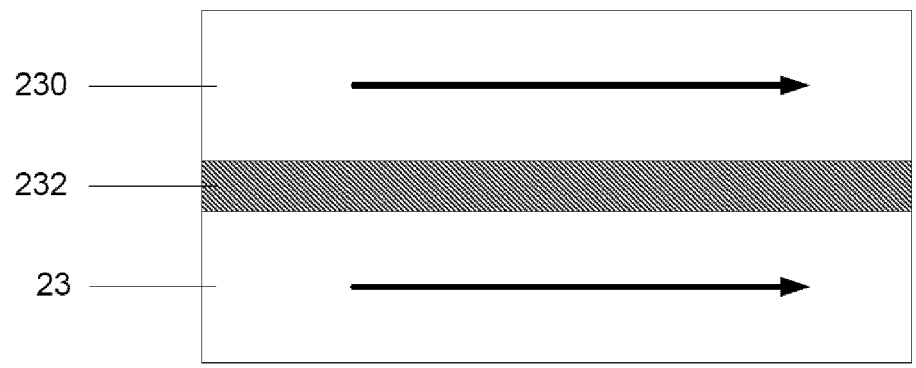
FIG. 6 represents the storage layer of FIG. 1 according to yet another embodiment.

In yet another embodiment represented in FIG. 6, the magnetic tunnel junction 2 further comprises an antiferromagnetic layer 232 disposed between the first and second storage layers 23, 230. The antiferromagnetic layer 232 can typically be made of IrMn or PtMn and have a thickness in a range comprised between 0.5 nm and 2 nm. Due to its small thickness, the antiferromagnetic layer 232 cannot remain pinned upon switching the magnetization of the first and/or second storage layers 23, 230 and thus, cannot exchange bias these two storage layers 23, 230 at room temperature. Moreover, the IrMn or PtMn material of the antiferromagnetic layer 232 has a large spin orbit interaction and, due to locally competing ferromagnetic and antiferromagnetic exchange interactions, a high degree of magnetic disorder exists at the interface between the antiferromagnetic layer 232 and the first and second storage layers 23, 230. Consequently, the coupling between the antiferromagnetic layer 232 and the first and second storage layers 23, 230 can generate a significant effective damping.

In the storage layer configuration of FIG. 6, the antiferromagnetic layer 232 can increase the thermal stability of the first and second storage layers 23, 230 at room temperature. Indeed, the IrMn or PtMn alloys making the antiferromagnetic layer 232 usually have large magnetocrystalline anisotropy, and the overall anisotropy energy KV corresponds to the sum of the anisotropy energy KV of the first and second storage layers 23, 230, and of the antiferromagnetic layer 232. The first and second storage layers 23, 230 can thus be made thermally stable at smaller dimension, since larger anisotropy K allows fulfilling the criterion $KV>50\ k_BT$ for magnetic tunnel junctions 2 with a smaller dimension V.

Furthermore, during the write operation, the write current pulse flowing through the magnetic tunnel junction 2 not only induces the transfer of the angular spin moment between the spin-polarized electrons and the magnetic moment of the first and second storage layers 23, 230, but also induces a temporary Joule heating of the magnetic tunnel junction 2. In the configuration of FIG. 6, the Joule heating can reduce the anisotropy of the antiferromagnetic layer 232, possibly to zero in the case the temperature reach the Néel temperature. In this case, the switching of the magnetization of the first and second storage layers 23, 230 can be easier, while the first storage layers 23 has an enhanced damping compared to a configuration without the antiferromagnetic layer 232.

During the write operation with the configuration of FIGS. 4 to 6, the first and second storage layers 23, 230 are switched simultaneously according to the spin polarization of the write current and the write current polarity.

A memory device (not shown) can be formed by assembling an array comprising a plurality of magnetic elements addressable by rows and columns, each magnetic element containing the magnetic tunnel junction 2 in accordance with the disclosed embodiments.

In an embodiment not represented, the memory device comprises a plurality of the magnetic elements where the magnetic tunnel junction 2 of each magnetic element is connected to one selection transistor and one current line. In the memory device array, each current line can address several magnetic tunnel junctions 2 in a row, and a word line (not shown) can address several selection transistors in a column. The current and word lines can be connected to the outputs of a row addressing circuit (not shown) and column addressing circuit (also not shown).

Alternatively, in the memory device, several magnetic tunnel junctions 2 in a row can be addressed by the bit line, and several magnetic tunnel junctions 2 in a column can be addressed by the word line, as in the cross-point configuration.

The disclosure is susceptible to various modifications and alternative forms, and specific examples thereof have been shown by way of example in the drawings and are herein described in detail. It should be understood, however, that the disclosure is not to be limited to the particular forms or methods disclosed, but to the contrary, the disclosure is to cover all modifications, equivalents, and alternatives.

Figure 7:
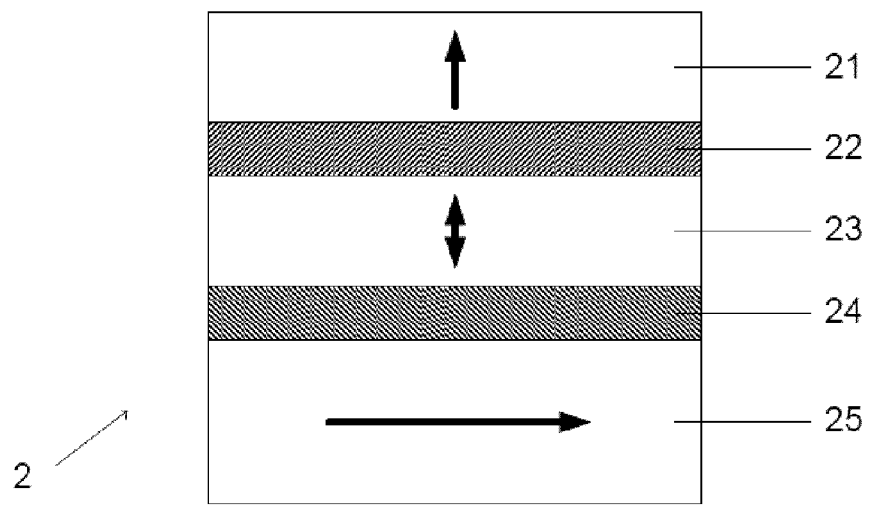
FIG. 7 shows the magnetic tunnel junction according to another embodiment.

For example, in an embodiment represented in FIG. 7, the polarizing layer 25 has a magnetization that is oriented in-plane and the reference and first storage layers 21, 23 have a magnetization respectively oriented out-of-plane. In the configuration of FIG. 7, the spins of the write current are polarized with a spin precession direction that is in-plane and perpendicularly with the magnetization direction of the reference and first storage layers 21, 23. However, in such configuration, the damping constant of the first storage layer 23 can be intrinsically large due to the large perpendicular magnetocrystalline anisotropy required to maintain the magnetization of the first storage layer 23 out-of-plane. In the other hand, decreasing the damping constant while maintaining perpendicular anisotropy can be difficult.

Figure 8:
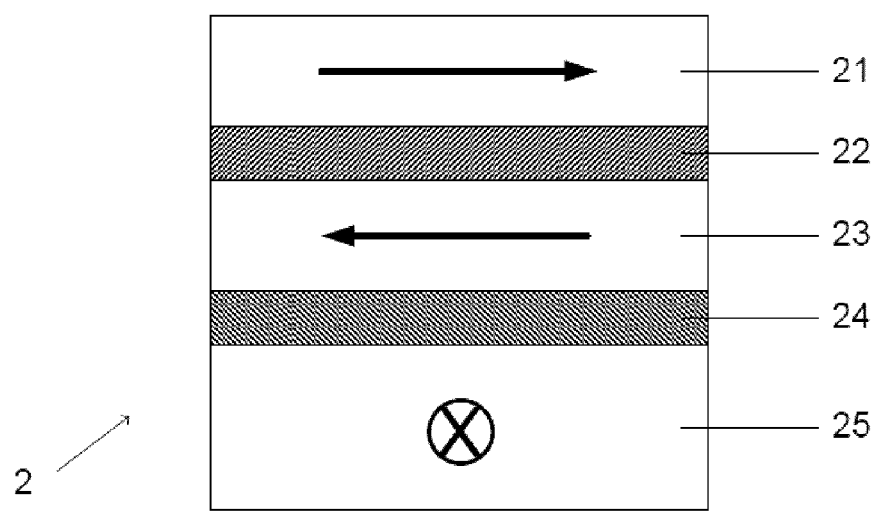
FIG. 8 shows the magnetic tunnel junction according to yet another embodiment.

In another embodiment represented in FIG. 8, the polarizing layer 25 and the reference and first storage layers 21, 23 have a magnetization that is oriented in-plane. In the example of FIG. 8, the magnetization of the polarizing layer 25 is shown entering the page and oriented perpendicular to the magnetization direction of the reference and first storage layers 21, 23. Here, the spins of the write current are polarized in-plane with a spin precession direction that is perpendicular to the magnetization direction of the reference and storage layers 21, 23.

The magnetic tunnel junction 2, and thus the memory device according to the embodiments disclosed herein allows using a write current that is smaller than the one used in conventional STT-based MRAM cells. For example, in the perpendicular configuration of FIG. 1, the spins of the write current are polarized perpendicularly to the magnetization of the first storage layer 23 allowing for a decrease in the critical write current $J_c$ down to about 1 MA/cm$^2$.

REFERENCE NUMBERS AND SYMBOLS 2 magnetic tunnel junction
21 reference layer
22 insulating layer
23 first storage layer
24 non-magnetic spacer layer
25 magnetic polarizing layer
230 second storage layer
231 antiferromagnetically coupling layer
232 antiferromagnetic layer
$a_J$ amplitude of spin torque
e electron charge
f precession frequency
$g(\theta)$ spin torque efficiency
J injected spin polarized current
$J_c$ critical write current
$k_B$ Boltzmann constant
KV anisotropy energy
$M_s$ saturation magnetization
$R_{max}$ high magnetic tunnel junction resistance
$R_{min}$ low magnetic tunnel junction resistance
$R_{ref}$ junction resistance of a reference cell
T temperature
V volume
α intrinsic damping constant
$\hbar$ Planck's constant
θ angle between the injected spins and the local magnetization

What is claimed is:

1. A magnetic tunnel junction, comprising:
a reference layer having a fixed magnetization direction,
a first storage layer having a magnetization direction that is adjustable relative to the magnetization direction of the reference layer by passing a write current through said magnetic tunnel junction, and
an insulating layer disposed between said reference layer and first storage layer;
wherein
the magnetic tunnel junction further comprises a polarizing device (25) to polarize the spins of the write current oriented perpendicular with the magnetization direction of the reference layer;
and wherein
said first storage layer has a damping constant above 0.02.

2. The magnetic tunnel junction of claim 1, wherein the polarizing device is a polarizing layer having a magnetization oriented perpendicular to the magnetization direction of the first storage layer.

3. The magnetic tunnel junction of claim 1, wherein the magnetization of said polarizing layer is oriented out of plane and the respective magnetizations of the reference and first storage layers are oriented in-plane.

4. The magnetic tunnel junction of claim 1, wherein the magnetization of said polarizing layer is oriented in-plane and the respective magnetizations of the reference and first storage layers are oriented out-of-plane.

5. The magnetic tunnel junction of claim 1, wherein the magnetization of said polarizing layer and the respective magnetizations of the reference and first storage layers are oriented in-plane but perpendicular one to another.

6. The magnetic tunnel junction of claim 1, wherein said first storage layer is made from a transition metal-based alloy containing at least one element chosen from Pt, Pd, Ir, Au, or a rare earth element.

7. The magnetic tunnel junction of claim 6, wherein the transition metal-based alloy is a Co, Fe, or Ni-based alloy.

8. The magnetic tunnel junction of claim 6, wherein said at least one rare earth element is chosen from Sm, Tb, Gd, Er, or Ho.

9. The magnetic tunnel junction of claim 1, wherein said magnetic tunnel junction further comprises a second storage layer allowing a magnetoresistance greater than 50%.

10. The magnetic tunnel junction of claim 9, wherein said second storage layer contacts the insulating layer.

11. The magnetic tunnel junction of claim 9, wherein said second storage layer is made from a transition metal-based alloy.

12. The magnetic tunnel junction of claim 11, wherein the transition metal-based alloy is a Co, Fe, or Ni-based alloy.

13. The magnetic tunnel junction of claim 9, wherein said magnetic tunnel junction further comprises a coupling layer disposed between the first storage layer and the second storage layer.

14. The magnetic tunnel junction of claim 13, wherein said coupling layer is an antiferromagnetically coupling layer coupling antiferromagnetically said first and second storage layers.

15. The magnetic tunnel junction of claim 14, wherein said antiferromagnetically coupling layer is made of ruthenium.

16. The magnetic tunnel junction of claim 14, wherein said antiferromagnetically coupling layer has a thickness comprised between 0.6 nm and 0.9 nm.

17. The magnetic tunnel junction of claim 13, wherein said coupling layer is an antiferromagnetic layer.

18. The magnetic tunnel junction of claim 17, wherein said antiferromagnetic layer is made of an alloy chosen from IrMn or PtMn.

19. The magnetic tunnel junction of claim 17, wherein said antiferromagnetic layer has a thickness comprised between 0.5 nm and 3 nm.

20. A magnetic element comprising:
a magnetic tunnel junction formed from an insulating layer disposed between a reference layer, having a fixed magnetization direction, and a first storage layer having a magnetization direction that is adjustable relative to the magnetization direction of the reference layer;

a selection transistor being electrically connected to said magnetic tunnel junction and controllable via a word line; and a current line, electrically connected to said magnetic tunnel junction, said current line passing a write current for switching the second magnetization of said first storage layer;

wherein said magnetic tunnel junction further comprises a polarizing device to polarize the spins of the write current oriented perpendicular with the magnetization direction of the reference layer during a write operation;

and wherein said first storage layer has a damping constant above 0.02.

21. The magnetic element of claim 20, wherein the polarizing device is a polarizing layer having a magnetization oriented perpendicular to the magnetization direction of the first storage layer.

22. The magnetic element of claim 20, wherein the magnetization of said polarizing layer is oriented out of plane and the respective magnetizations of the reference and first storage layers are oriented in-plane.

23. The magnetic element of claim 20, wherein the magnetization of said polarizing layer is oriented in-plane and the respective magnetizations of the reference and first storage layers are oriented out-of-plane.

24. The magnetic element of claim 20, wherein the magnetization of said polarizing layer and the respective magnetizations of the reference and first storage layers are oriented in-plane and perpendicular one to another.

25. The magnetic element of claim 20, wherein said first storage layer is made from a transition metal-based alloy containing at least one element chosen from Pt, Pd, Ir, Au, or a rare earth element.

26. The magnetic element of claim 25, wherein the transition metal-based alloy is a Co, Fe, or Ni-based alloy.

27. The magnetic element of claim 25, wherein said at least one rare earth element is chosen from Sm, Tb, Gd, Er, or Ho.

28. The magnetic element of claim 20, wherein said magnetic tunnel junction further comprises a second storage layer having a magnetoresistance greater than 50%.

29. The magnetic element of claim 28, wherein said second storage layer contacts the insulating layer.

30. The magnetic element of claim 28, wherein said second storage layer is made from a transition metal-based alloy.

31. The magnetic element of claim 30, wherein the transition metal-based alloy is a Co, Fe, or Ni-based alloy.

32. The magnetic element of claim 28, wherein said magnetic tunnel junction further comprises a coupling layer disposed between the first storage layer and the second storage layer.

33. The magnetic element of claim 32, wherein said coupling layer is an antiferromagnetically coupling layer coupling antiferromagnetically said first and second storage layers.

34. The magnetic element of claim 33, wherein said antiferromagnetically coupling layer is made of ruthenium.

35. The magnetic element of claim 33, wherein said antiferromagnetically coupling layer has a thickness comprised between 0.6 nm and 0.9 nm.

36. The magnetic element of claim 32, wherein said coupling layer is an antiferromagnetic layer.

37. The magnetic element of claim 36, wherein said antiferromagnetic layer is made of an alloy chosen from IrMn or PtMn.

38. The magnetic element of claim 36, wherein said antiferromagnetic layer has a thickness comprised between 0.5 nm and 2 nm.

39. A magnetic memory device formed by assembling an array comprising a plurality of magnetic element, each magnetic element comprising:

a magnetic tunnel junction formed from a reference layer having a fixed magnetization direction, a first storage layer having a magnetization direction that is adjustable relative to the magnetization direction of the reference layer and having a damping constant above 0.02, an insulating layer disposed between said reference layer and first storage layer, and a polarizing device to polarize the spins of the write current oriented perpendicular with the magnetization direction of the reference layer; and a current line, electrically connected to said magnetic tunnel junction, said current line passing a write current for switching the second magnetization of said first storage layer;

wherein several magnetic tunnel junctions of said magnetic elements can be addressed simultaneously by the current line and the word line.

40. The magnetic memory device of claim 39, wherein said each magnetic element further comprises a selection transistor and a word line, the selection transistor being electrically connected to said magnetic tunnel junction and controllable via the word line.

* * * * *